United States Patent
Schwarz et al.

(10) Patent No.: US 10,205,071 B2
(45) Date of Patent: Feb. 12, 2019

(54) METHOD OF PRODUCING OPTOELECTRONIC SEMICONDUCTOR COMPONENTS, AND OPTOELECTRONIC SEMICONDUCTOR COMPONENT

(71) Applicant: OSRAM Opto Semiconductors GmbH, Regensburg (DE)

(72) Inventors: Thomas Schwarz, Regensburg (DE); Andreas Biebersdorf, Regensburg (DE); Dirk Becker, Langquaid (DE); Bernd Barchmann, Regensburg (DE); Björn Hoxhold, Sinzing (DE); Philipp Schlosser, Regensburg (DE); Andreas Waldschik, Wolmirstedt (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/577,045

(22) PCT Filed: May 19, 2016

(86) PCT No.: PCT/EP2016/061317
§ 371 (c)(1),
(2) Date: Nov. 27, 2017

(87) PCT Pub. No.: WO2016/188867
PCT Pub. Date: Dec. 1, 2016

(65) Prior Publication Data
US 2018/0145234 A1    May 24, 2018

(30) Foreign Application Priority Data

May 27, 2015   (DE) .................. 10 2015 108 345

(51) Int. Cl.
*H01L 33/60*    (2010.01)
*H01L 33/62*    (2010.01)
(Continued)

(52) U.S. Cl.
CPC .......... *H01L 33/60* (2013.01); *H01L 25/0753* (2013.01); *H01L 33/005* (2013.01);
(Continued)

(58) Field of Classification Search
CPC ..... H01L 33/486; H01L 33/62; H01L 33/483; H01L 33/105; H01L 21/78–21/786
See application file for complete search history.

(56) References Cited

U.S. PATENT DOCUMENTS 7,180,924 B2   2/2007  Kondo
9,338,897 B2   5/2016  Otsuka et al.
(Continued)

FOREIGN PATENT DOCUMENTS

DE   10 2010 045 783 A1   3/2012
DE   20 2011 050 976 U1   1/2013
(Continued)

OTHER PUBLICATIONS

Nanotherm® LC: Performance MCPCB substrate, www.camnano.com.
(Continued)

*Primary Examiner* — Changhyun Yi
(74) *Attorney, Agent, or Firm* — DLA Piper LLP (US)

(57) ABSTRACT

A method of producing optoelectronic semiconductor components includes providing a carrier with a carrier underside and a carrier top. The carrier has a metallic core material and at least on the carrier top a metal layer. A dielectric mirror is applied to the core material. At least two holes are formed through the carrier. A ceramic layer with a thickness of at most 150 μm at least on the carrier underside and in the holes is produced. The ceramic layer includes the core material as a component. Metallic contact layers are applied to at least subregions of the ceramic layer on the carrier underside and in the holes so that the carrier top electrically connects to the
(Continued)

carrier underside through the holes. At least one radiation-emitting semiconductor chip is applied to the carrier top and the semiconductor chip is electronically bonded to the contact layers.

14 Claims, 7 Drawing Sheets

(51) Int. Cl.
  H01L 25/075 (2006.01)
  H01L 33/48 (2010.01)
  H01L 33/64 (2010.01)
  H01L 33/00 (2010.01)
(52) U.S. Cl.
  CPC ............ *H01L 33/486* (2013.01); *H01L 33/62* (2013.01); *H01L 33/647* (2013.01); *H01L 2224/48091* (2013.01); *H01L 2224/48137* (2013.01); *H01L 2224/48471* (2013.01); *H01L 2224/48479* (2013.01); *H01L 2224/73265* (2013.01); *H01L 2924/00014* (2013.01); *H01L 2924/181* (2013.01); *H01L 2933/0033* (2013.01); *H01L 2933/0075* (2013.01)

(56) References Cited

U.S. PATENT DOCUMENTS

| | | | |
|---|---|---|---|
| 2009/0166664 A1* | 7/2009 | Park | H01L 33/486 257/99 |
| 2010/0032705 A1 | 2/2010 | Shin et al. | |
| 2010/0140637 A1* | 6/2010 | Donofrio | H01L 33/42 257/98 |
| 2011/0101392 A1 | 5/2011 | Park et al. | |
| 2011/0140150 A1 | 6/2011 | Shum | |
| 2011/0291153 A1* | 12/2011 | Yang | H01L 33/486 257/99 |
| 2013/0160978 A1 | 6/2013 | Shin et al. | |
| 2014/0225139 A1 | 8/2014 | Park et al. | |
| 2014/0239328 A1* | 8/2014 | Lee | H01L 33/62 257/98 |
| 2014/0293554 A1 | 10/2014 | Shashkov et al. | |
| 2015/0069438 A1 | 3/2015 | Tong | |
| 2015/0118391 A1 | 4/2015 | Kilhenny | |
| 2015/0295141 A1 | 10/2015 | Schwarz et al. | |
| 2015/0303170 A1* | 10/2015 | Kim | H01L 21/78 257/737 |
| 2016/0027977 A1 | 1/2016 | Seo et al. | |
| 2017/0331019 A1 | 11/2017 | Schwarz et al. | |

FOREIGN PATENT DOCUMENTS

| | | |
|---|---|---|
| DE | 10 2012 110 774 | 5/2014 |
| DE | 10 2014 116 529 | 5/2016 |
| JP | 2002-292924 A | 10/2002 |
| JP | 2003-347672 A | 12/2003 |
| JP | 2007-250805 A | 9/2007 |
| JP | 2012-169583 A | 9/2012 |
| JP | 2013-038018 A | 2/2013 |
| JP | 2014-110332 A | 6/2014 |
| JP | 2014-120738 A | 6/2014 |
| WO | 2012/107755 A1 | 8/2012 |

OTHER PUBLICATIONS

Nanotherm® LC: Unlock the power of your LEDs, www.camnano.com.

Notice of Reasons for Rejection dated Dec. 4, 2018, of counterpart Japanese Application No. 2017-558021, along with an English translation.

* cited by examiner

FIG. 2F1

FIG. 2F2

METHOD OF PRODUCING OPTOELECTRONIC SEMICONDUCTOR COMPONENTS, AND OPTOELECTRONIC SEMICONDUCTOR COMPONENT

TECHNICAL FIELD

This disclosure relates to a method of producing optoelectronic semiconductor components and optoelectronic semiconductor components produced accordingly.

BACKGROUND

There is a need to provide a method with which a carrier for semiconductor chips can be produced efficiently, which carrier has a high reflectivity for radiation generated in operation.

SUMMARY

We provide a method of producing optoelectronic semiconductor components including A) providing a carrier with a carrier underside and a carrier top, wherein the carrier has a metallic core material and at least on the carrier top a metal layer and following this a dielectric mirror are applied to the core material, B) forming at least two holes through the carrier, C) producing a ceramic layer with a thickness of at most 150 µm at least on the carrier underside and in the holes, wherein the ceramic layer includes the core material as a component, D) applying metallic contact layers to at least subregions of the ceramic layer on the carrier underside and in the holes so that the carrier top electrically connects to the carrier underside through the holes, and E) applying at least one radiation-emitting semiconductor chip to the carrier top and electrical bonding of the semiconductor chip to the contact layers.

We also provide an optoelectronic semiconductor component produced by the method including the carrier with the carrier underside and with the carrier top, and the at least one semiconductor chip emitting the radiation during operation on the carrier top, wherein the carrier has the metallic core material and the metal layer and following this the dielectric mirror are applied to the core material at least on the carrier top, the at least two holes are formed through the carrier, the ceramic layer with a thickness of at most 100 µm is located at least on the carrier underside and in the holes and the ceramic layer includes the core material as a component, the metallic contact layers are applied to at least subregions of the carrier underside and in the holes so that the carrier top electrically connects to the carrier underside through the holes and the contact layers on the carrier underside are set up for the external electrical and mechanical attachment of the semiconductor component, and the semiconductor chip electrically connects to the contact layers by electrical bonding means.

REFERENCE SIGN LIST

Figure 1A:
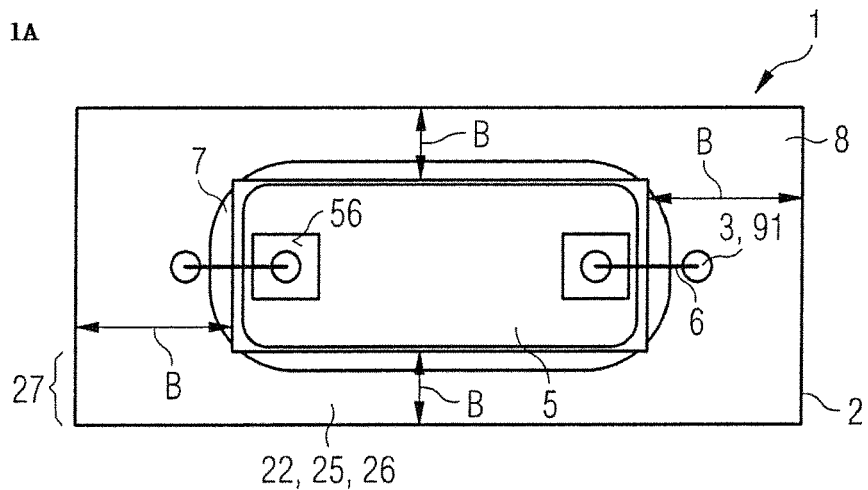
FIGS. 1A-1C show an example of an optoelectronic semiconductor component.

1 Optoelectronic semiconductor component
2 Carrier
21 Carrier underside
22 Carrier top
24 Core material
25 Metal layer
26 Dielectric mirror
27 Edge region
28 Trench on the carrier underside
3 Hole
31 Ridge
4 Ceramic layer
5 Radiation-emitting semiconductor chip
51 Substrate
55 Semiconductor layer sequence
56 Electrical contact surface
6 Electrical bonding means
7 Adhesive
8 Cast body
91 Metallic contact layer
92 Metallic contact layer
93 Growth layer
94 Bonding metal
11 Protective layer
12 Photoresist
13 Protective film
B Width of edge region of carrier
S Separation region

DETAILED DESCRIPTION

Our method produces optoelectronic semiconductor components. The semiconductor components are preferably light-emitting diodes. In particular, the semiconductor components emit visible light during operation.

The method includes providing a carrier. The carrier has a carrier underside and a carrier top lying opposite this. Both the carrier underside and the carrier top are major sides of the carrier. The carrier underside and the carrier top are preferably formed level and planar at least in places.

The carrier may have a metallic core material. The core material is thus a metal or a metal alloy. The mechanical stability of the carrier is preferably achieved mainly or solely by the core material. The thickness of the core material is, for example, at least 50 µm or 100 µm and/or at most 1 mm or 0.5 mm or 0.3 mm. The thickness is preferably roughly 0.2 mm.

A metal layer may be applied directly to the core material at least on the carrier top or exclusively on the carrier top. The metal layer reflects radiation generated in operation of the optoelectronic semiconductor component. The metal layer is preferably a layer of silver, in particular of highly pure silver.

A dielectric mirror may be applied to the silver layer on a side remote from the core material. In particular, the dielectric mirror is located directly on the metal layer. The dielectric mirror has at least two or at least four or at least six and/or at most 20 or 14 alternating layers with different refractive indices. In other words, the dielectric mirror can be a so-called "Bragg mirror." The dielectric mirror also reflects radiation generated during operation of the semiconductor component.

The method may comprise the step of forming at least two holes through the carrier. The holes extend from the carrier top to the carrier underside. Holes mean, as seen in a plan view of the carrier top, for instance, the holes are enclosed all around by a material of the carrier, in particular the core material. In other words, seen in plan view, the holes lie inside the carrier top and not directly on its edge.

The method may have the step of producing a ceramic layer at least on the carrier underside. The ceramic layer is preferably also formed in the holes. The thickness of the ceramic layer in this case, for example, is at most 150 µm or 75 µm or 50 µm or 30 µm and/or at least 1 µm or 5 µm. The ceramic layer is preferably a continuous, uninterrupted layer. Specifically, electrical insulation is provided relative to the core material by the ceramic material if another component is applied to the ceramic layer.

The ceramic layer may contain the core material as a component. In other words, the ceramic is then an oxide or a nitride of the metal that constitutes the core material, for example.

Metallic contact layers are applied to at least subregions of the ceramic layer. The metallic contact layers are produced in particular on the carrier underside and in the holes. Via the metallic contact layers an electrical connection is created through the holes between the carrier top and the carrier underside.

The metallic contact layers on the carrier underside may be set up for an external electrical contacting of the optoelectronic semiconductor component. In other words, the semiconductor component can then be contacted mechanically and electrically via the electrical contact layers on the carrier underside, for example, by soldering or electrically conductive gluing. This means that the finished optoelectronic semiconductor component is a surface-mounted component, which is also described as an SMD component.

At least one radiation-emitting semiconductor chip may be applied to the carrier top. The one or the several semiconductor chips are electrically connected to the contact layers.

The method may comprise at least the following steps, preferably in the order indicated:
A) provision of a carrier with a carrier underside and a carrier top, wherein the carrier has a metallic core material and a metal layer and following this a dielectric mirror are applied to the contact material at least on the carrier top,
B) formation of at least two holes through the carrier,
C) production of a ceramic layer with a thickness of at most 100 µm at least on the carrier underside and in the holes, wherein the ceramic layer comprises the core material as a constituent,
D) application of metallic contact layers to at least subregions of the ceramic layer on the carrier underside and in the holes so that the carrier top is electrically connected to the carrier underside through the holes, and
E) application of at least one radiation-emitting semiconductor chip to the carrier top and electrical connection of the semiconductor chip to the contact layers.

To achieve a high efficiency, component forms having a volume emitter as radiation source are dependent on the semiconductor chips being mounted on a reflector with a high reflectivity for the radiation generated. The higher the reflectivity of the reflector, the higher also the efficiency of the component. An SMD design is desirable here, as corresponding designs are easy and flexible to handle.

Due to the method described here, carriers can be used that have a high reflectivity on account of the metal layer and the dielectric mirror. By producing the ceramic layer directly on and from the core material of the carrier, the metallic contact layers can be applied to the carrier for an efficient electrical contacting. An SMD component with a high reflectivity, a high thermal conductivity in a direction away from the semiconductor chip and with small component dimensions is likewise achievable by this. Due to the small component dimensions, a cost saving in respect of the carrier material can also be realized so that overall less carrier material is to be used than for components that are based on leadframes, for example.

The core material may be aluminum or an aluminum alloy. The ceramic layer is then formed of aluminum nitride or, preferably of aluminum oxide. The thickness of the ceramic layer is in particular 30 µm at most.

The dielectric mirror may have alternating layers of silicon dioxide and titanium dioxide. To achieve high reflectivity even in the event of different incident angles of radiation onto the dielectric mirror and to guarantee a high reflectivity not only at a single wavelength, it is possible for layer pairs of different thicknesses to be located within the dielectric mirror. Such a dielectric mirror is also described as a chirped mirror.

The carrier may have a circumferential edge region that, when seen in a plan view of the carrier top, surrounds the semiconductor chip all around and forms a closed path around the semiconductor chip. A mean width of the edge region, seen in plan view, is at least 5% or 10% and/or at most 60% or 45% or 30% or 20% of a mean edge length of the semiconductor chip, for example. In other words, the carrier seen in plan view, then has similar dimensions to the semiconductor chip itself.

The holes, seen in plan view, may be located in the edge region. The diameter of the holes in this case is preferably at most 40% or 55% of the mean width of the edge region.

Before step B), a trench may be formed on the carrier underside. Seen in plan view, the trench runs preferably all around the carrier underside. The trench is located all around on an edge of the carrier. In other words, the thickness of the carrier at the edge is reduced by the trench. For example, the thickness of the carrier at the surrounding edge is reduced by the trench to at least 15% or 25% and/or to at most 70% or 50% or 40% of an original thickness of the carrier.

The holes may lie in the area of the trench. In other words, the holes penetrate the carrier in an area that is already thinned by the trench. Here the trench has a greater width than the holes. For example, the width of the trench exceeds the diameter of the holes by at least a factor of 1.5 or 2. In particular, the holes are located, seen in plan view, on two opposing sides of the semiconductor chip.

The trench may have a greater width in the area of the holes than in remaining regions. It can be achieved by this that the holes, seen in plan view, are located completely inside the trench.

The holes may be located in the carrier, seen in a plan view of the carrier top, underneath the semiconductor chip after step E). The holes are then preferably also located outside the trench, if a trench is present. In this case, the surrounding trench preferably has a uniform, constant width.

The contact layers may be formed in step D) likewise in the holes and close the holes on the carrier top. The contact layers are then located on the carrier top preferably only inside the holes and end flush with remaining regions of the carrier top. It is possible that by closure of the holes by the contact layers, terminal areas are formed, respectively, in particular for bond wires, in step E). In this case, the semiconductor chip then connects electrically via the bond wires to the closures of the holes, formed by the contact layers.

Electrical contact regions, in particular to attach bond wires to the carrier top, may be located, seen in plan view, next to the semiconductor chip and next to the holes. In the electrical contact regions, the electrical contact layers are formed and preferably extend to the electrical contact regions designed as bond pads, for instance. A proportion of a surface of the electrical contact regions and the electrical contact layers on the carrier top, seen in plan view, is preferably at most 10% or 2% or 0.3% of a total surface of the carrier top.

The semiconductor chip may be attached by a transparent and/or electrically insulating adhesive to the carrier top. Thus, the adhesive does not form any optical barrier between the semiconductor chip and the metal layer and the dielectric mirror. The adhesive preferably extends all over between the semiconductor chip and the carrier. Alternatively it is possible for the adhesive to be applied only at points, for example, at corner regions of the semiconductor chip.

The semiconductor chip may have a substrate transmissive for the emitted radiation. In particular, the substrate is a sapphire substrate.

The semiconductor chip may have a semiconductor layer sequence that generates radiation during operation. It is possible for the semiconductor layer sequence to be grown epitaxially on the substrate.

The semiconductor layer sequence is preferably based on a III-V compound semiconductor material. The semiconductor material is a nitride compound semiconductor material such as $Al_n In_{1-n-m} Ga_m N$, for example, or a phosphide compound semiconductor material such as $Al_n In_{1-n-m} Ga_m P$ or also an arsenide compound semiconductor material such as $Al_n In_{1-n-m} Ga_m As$, wherein respectively $0 \leq n \leq 1$, $0 \leq m \leq 1$ and $n+m \leq 1$. The semiconductor layer sequence can have dopants and additional constituents in this case. However, for the sake of simplicity only the substantial constituents of the crystal lattice of the semiconductor layer sequence, thus Al, As, Ga, In, N or P, are specified, even if these can be partly replaced and/or supplemented by small quantities of other substances.

The adhesive may extend, starting out from the carrier and the carrier top, as far as a side of the semiconductor chip remote from the carrier. Thus, the height of the adhesive is locally then approximately equal to a thickness of the semiconductor chip.

The adhesive may form a ramp for electrical bonding means. An electrical connection is produced by the bonding means between electrical contact surfaces of the semiconductor chip and the holes with the contact layers. The electrical bonding means is preferably layered in this case, for example, similar to a conductor track. Layered can mean that the thickness of the electrical bonding means is at most 20% or 10% or 5% of a mean width of the connection means.

A metallic growth layer may be applied in step D) all over to the ceramic layer on the carrier underside and in the holes. The growth layer is set up so that the contact layers can be grown on this or applied to it. For example, the growth layer is produced by sputtering or by vapor deposition.

The growth layer may be covered in places by a protective layer at least on the carrier underside. The protective layer can be a photoresist. It is achieved by the protective layer that the contact layers are only produced in regions of the growth layer not covered by the protective layer. This means that no or no significant quantity of material of the contact layers is then deposited on the protective layer.

The metal layer and the dielectric mirror may cover the carrier top completely before step B). In step C), the metal layer and the dielectric mirror are removed only in the region of the holes. Thus, even the remaining carrier top is then formed completely by the metal layer and the dielectric mirror.

The carrier underside may be formed before step D) by the metallic core material. This means that the core material is then free of the metal layer and the dielectric mirror on the underside. Due to this, it is possible for the ceramic layer to be produced from the core material.

A carrier composite may be provided in which a plurality of carriers are combined for the semiconductor components. Following step E), the carrier composite is singulated into the carriers. Due to this, separation regions are preferably present between adjacent carriers. Singulation can take place in the separation regions, for example, by sawing, cutting or punching. Furthermore, the trenches surrounding the carriers are preferably present in the separation regions.

Several radiation-emitting semiconductor chips may be located on the carrier top. The semiconductor chips can be electrically activatable individually so that at least a dedicated hole and a dedicated via are then formed in the carrier for each of the semiconductor chips. It is likewise possible for the semiconductor chips taken all together or in groups to be brought together to form electric parallel circuits or series circuits. As well as the radiation-emitting semiconductor chips, other semiconductor chips, for example, to activate the radiation-emitting semiconductor chips or protect against damage by electrostatic discharges, can also be present.

Furthermore, we provide an optoelectronic semiconductor component. The semiconductor component is produced by a method as indicated in connection with one or more of the aforesaid examples. Features of the semiconductor component are therefore disclosed also for the method and vice versa.

The semiconductor component may have a carrier on which one or more semiconductor chips are mounted, that emit radiation during operation. The radiation is preferably in the near-ultraviolet, the visible or the near-infrared spectral range. The at least one semiconductor chip on the carrier top is connected via electrical bonding means, for example, by bond wires, and via the holes in the carrier electrically to the metallic contact layers on the carrier underside. The semiconductor component is thus preferably a surface-mounted semiconductor component.

An optoelectronic semiconductor component described here and a method described here are explained in greater detail below with reference to the drawings on the basis of examples. The same reference signs indicate identical elements in the individual figures here. However, no references to scale are shown, but rather individual elements are shown exaggeratedly large for a better understanding.

Figure 1B:
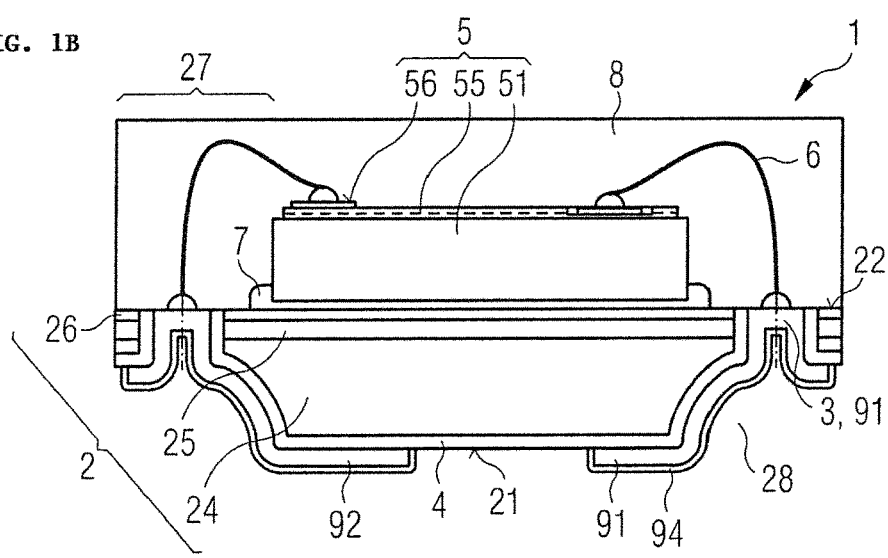
Figure 1C:
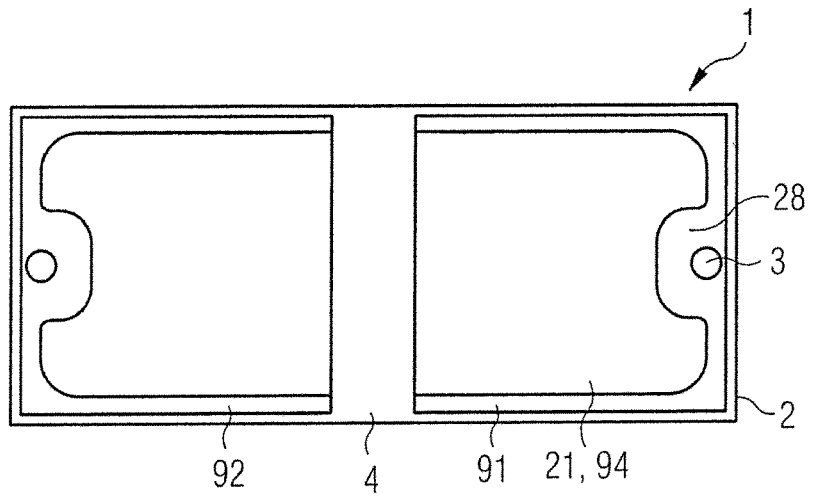

In FIG. 1, an example of an optoelectronic semiconductor component 1 is shown. FIG. 1A shows a plan view and FIG. 1C shows a bottom view. FIG. 1B is a sectional view along the dashed and dotted line running horizontally in FIGS. 1A and 1C.

The semiconductor component 1 comprises a carrier 2. The carrier 2 is formed of a core material 24, which is aluminum, copper, an aluminum alloy or a copper alloy, for example. Located directly on the core material 24 on a carrier top 22 is a metal layer 25 formed as a metallic mirror layer. The metal layer 25 is preferably a silver layer. Located directly on the metal layer 25 is a Bragg mirror 26. The Bragg mirror 26 comprises alternating layers of silicon dioxide and titanium dioxide, for example.

Due to the core material 24, the carrier 2 is itself electrically conductive in particular on a carrier underside 21. A ceramic layer 4 is therefore located on the carrier underside 21 and in holes 3 that penetrate the carrier 2. Two metallic contact layers 91, 92 or at least one of the contact layers 91, 92 is insulated electrically from the core material 24 by the ceramic layer 4.

The electrical contact layers 91, 92 extend from the carrier underside 21 through the holes 3 as far as the carrier top 22. Here, the holes 3 are closed by the contact layers 91, 92 on the carrier top 22. The semiconductor component 1 is electrically contactable externally and can be attached mechanically via the contact layers 91, 92.

A light-emitting diode chip 5 is applied to the carrier top 22. The light-emitting diode chip 5 has a substrate 51 on which a semiconductor layer sequence 55 is grown. The substrate 51 is preferably a sapphire substrate and the semiconductor layer sequence 55 is based on AlInGaN. The semiconductor layer sequence 55 comprises at least one active layer that generates light, in particular that generates blue light. Located on the semiconductor layer sequence 55 are two electrical contact surfaces 56, via which the semiconductor chip 5 is electrically connected. The contact surfaces 56 in this case are connected via electrical bonding means 6 in the form of bond wires to the contact layers 91, 92 on the holes 3. The semiconductor chip 5 is attached to the carrier 2 by an adhesive 7.

The substrate 51 of the semiconductor chip 5 is radiation-transmissive. To achieve a high efficiency of the semiconductor component 1, the carrier 2, which is optically connected to the semiconductor chip 5, must therefore have a high reflectivity. This is achieved by the metal layer 25 in combination with the dielectric mirror 26. Furthermore, the adhesive 7 is preferably transparent for the radiation generated by the semiconductor chip 5.

Seen in plan view, the carrier 2 surrounds the semiconductor chip 5 all around with an edge region 27, see in particular FIG. 1A. Seen in plan view, the edge region 27 here has a mean width B that is significantly smaller than the mean length of edges of the semiconductor chip 5. A component 1 is achievable by this that in plan view is limited to approximately a size of the semiconductor chip 5.

On the carrier underside 21, as seen in FIG. 1C, the contact layers 91, 92 are separated from one another by a gap. A trench 28 is also formed all around on the carrier underside 21, as seen in FIG. 1B. An edge of the carrier 2 is thinned by the trench 28. In the area of the holes 3, the trench 28 has a widening so that the holes 3 are located completely inside the trench 28.

A cast body 8 is optionally applied to the carrier 2 and the semiconductor chip 5, which body is preferably also present in all other examples. The cast body 8 is produced by injection molding or transfer molding, for example. The cast body 8 is in direct contact with the electrical bonding means 6 as well as with the semiconductor chip 5 and the carrier top 22. The cast body 8 is preferably limited to the carrier top 22 so that the carrier underside 21 and/or the holes 3 and the trench 28 are free from material of the cast body 8.

The cast body 8 can be formed from a radiation-transmissive, transparent material. It is likewise possible for a diffusing means, for instance in the form of diffuser particles, or a luminescent material or luminescent material mixture to be added to the cast body 8. Other than shown the cast body 8 can also be constructed in several layers and have various regions with different optical properties so that clear regions can alternate with diffusing regions and/or regions containing luminescent material.

To be able to electrically contact the semiconductor component 1 efficiently externally, a layer of a bonding metal 94 is preferably located on a side of the contact layers 91, 92 remote from the semiconductor chip 5.

FIG. 2 illustrates method steps of producing an optoelectronic semiconductor component 1. The carrier 2 is provided according to FIG. 2A. The core material 24 lies free on the carrier underside 21. On the carrier top 22 the metal layer 25 and the dielectric mirror 26 are applied continuously.

Figure 2A:
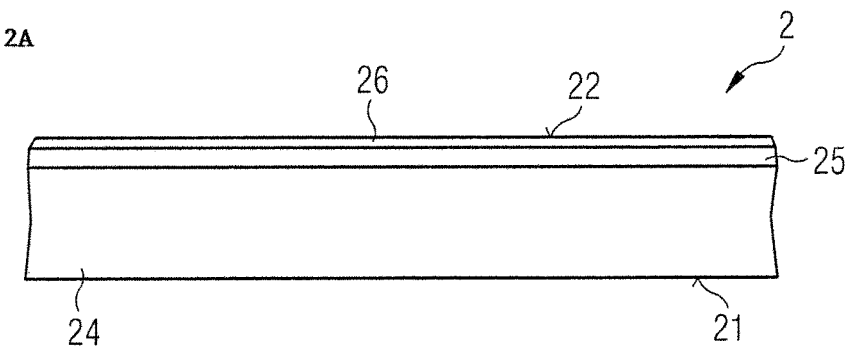
FIGS. 2A-2P show schematic sectional views of method steps of a method described here for production of optoelectronic semiconductor components.
Figure 2B:
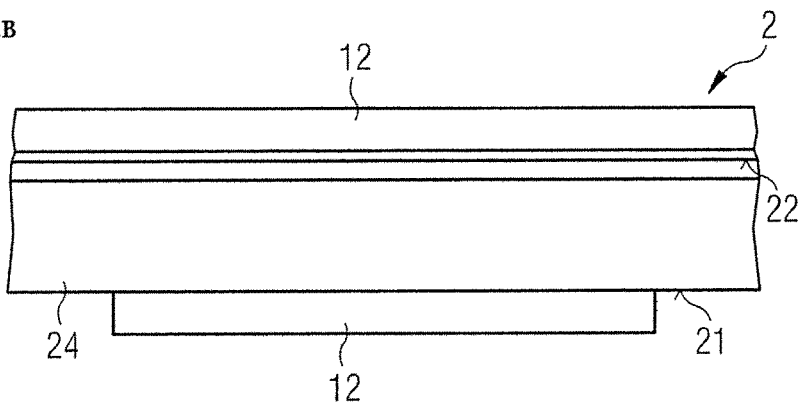

FIG. 2B shows that, to pattern the core material 24, a photoresist 12 is applied in places to the carrier underside 21. To protect the carrier top 22, a photoresist 12 can also be applied optionally all over to the carrier top 22.

Figure 2C:
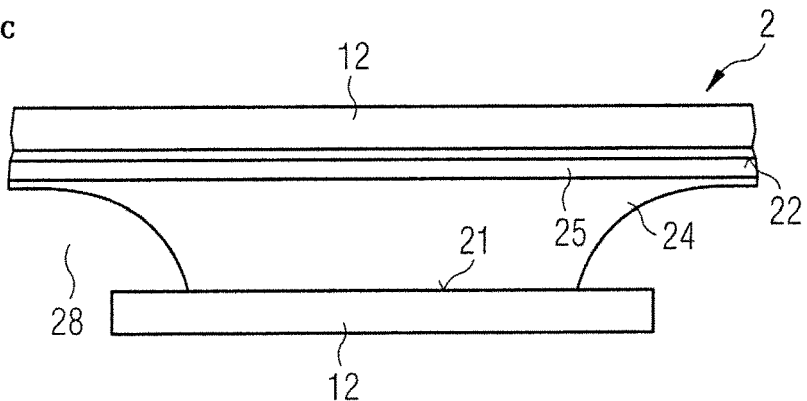

According to FIG. 2C, formation of the trenches 28 takes place in the regions of the carrier underside 21 not covered by the photoresist 12. As shown in FIG. 2C, the trenches 28 are produced by an isotropic wet chemical method. Undercuts are formed by this on the photoresist layer 12 on the carrier underside 21. During this etching of the trenches 28, the metal layer 25 is preferably not exposed in the area of the trenches 28, but is retained as a continuous, intact layer.

Deviating from the representation according to FIG. 2C, it is also possible to produce the trenches 28 by a directed, dry chemical etching.

Figure 2D:
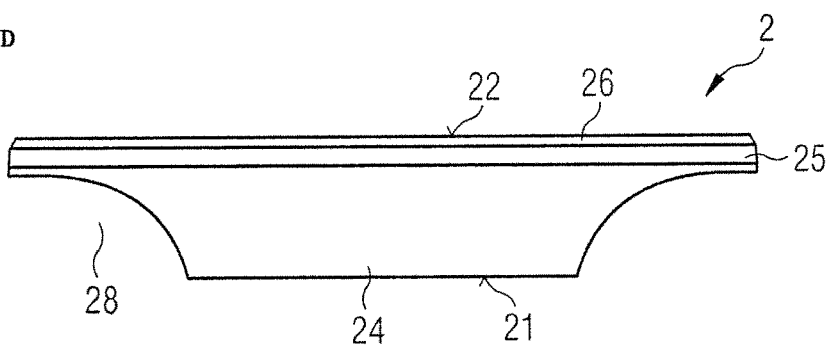

Then the photoresist 12 on the carrier underside 21 and on the carrier top 22 is removed, as shown in FIG. 2D. Alternatively, it is possible for the photoresist 12 to be dissolved only in areas on the carrier top 22, which areas are provided for the production of the holes 3 in the following method step.

Figure 2E:
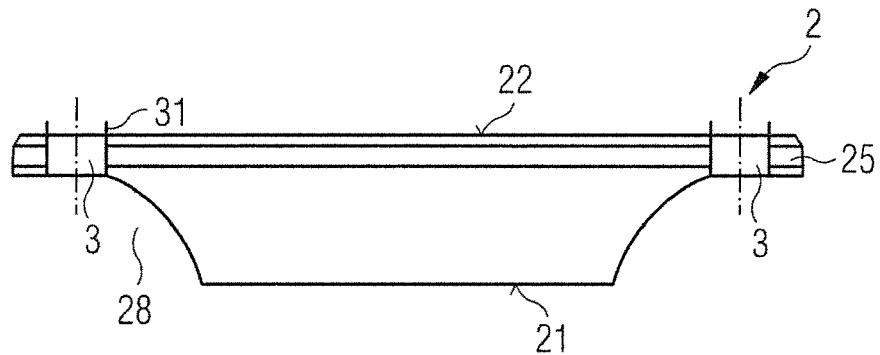
Figure 2E:
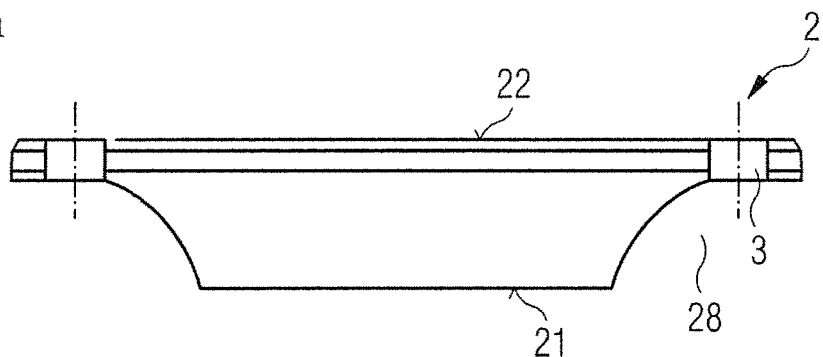
Figure 2E:
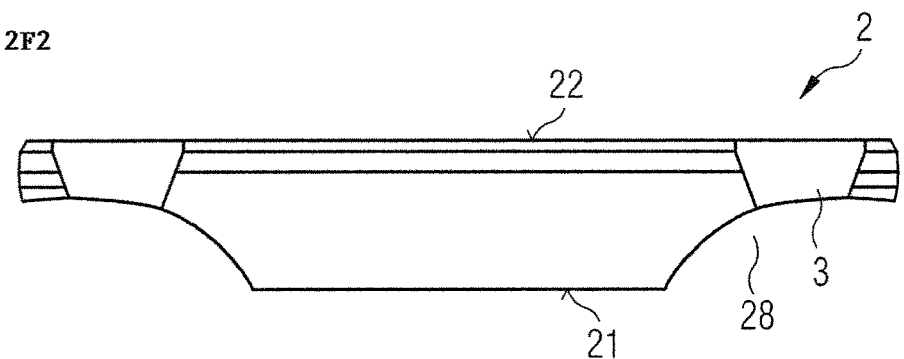

As shown in FIG. 2E, the holes 3 are formed through the carrier 2 in the area of the trenches 28. The holes 3 are limited here to the trenches 28. The closer the trenches 28 extend from the carrier underside 21 to the metal layer 25, the less the effort with which the holes 3 can be produced. For example, the holes 3 are produced by a laser process. During production of the holes 3, ridges 31 can be formed in particular on the carrier top 22.

Such ridges 31 are then optionally removed, see FIG. 2F1. This is accomplished by grinding or polishing, for example.

The holes 3 can alternatively be produced by machining such as milling, drilling or punching, or also by etching. The latter is shown in FIG. 2F2 as an alternative to the method step according to FIG. 2E. Such etching of the carrier top 22 can be carried out through a suitably patterned photoresist 12. If the holes 3 are etched, the holes can taper, starting out from the carrier top 22, in the direction of the carrier underside 21, until the holes 3 meet the trenches 28.

As in all other method steps, it is possible for an auxiliary carrier, not shown, to be present in each case, on which the carrier 2 or a carrier composite with several of the carriers 2 rests. Likewise a carrier composite of this kind can be held or clamped at one edge.

Figure 2G:
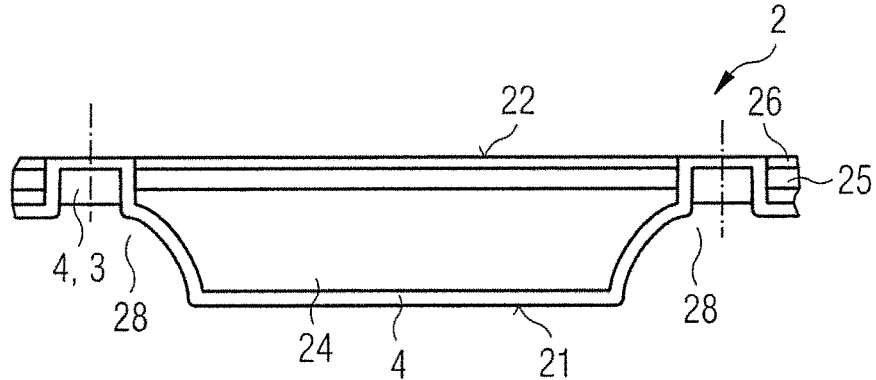

According to the method step shown in FIG. 2G, the ceramic layer 4 is produced on the core material 24. The ceramic layer 4 is preferably formed from a nanoceramic, for example as indicated in US 2014/0293554 A1, the subject matter of which is incorporated herein by reference. The ceramic layer 4 is in particular a nanocrystalline aluminum oxide layer with a mean grain size of 10 nm to 20 nm, for example. A high dielectric strength for voltages up to circa 1000 V at a thickness of roughly 20 μm and a specific thermal conductivity of 15 W/mK can be achieved by this.

The ceramic layer 4 is preferably produced on all exposed surfaces of the core material 24, thus on the carrier underside 21, in the trenches 28 and in the holes 3. It is possible that the ceramic layer 4, in particular starting from the core material 24, the metal layer 25 and the dielectric mirror 26 likewise overgrows in a lateral direction. This is possible in particular due to the fact that the metal layer 25 only has a small thickness of less than 300 nm, for example, and the dielectric mirror 26 has a thickness of less than 2 μm, for example. An overall thickness of the layers 25, 26 can thus be at most 20% or 10% of a thickness of the ceramic layer 4.

Figure 2H:
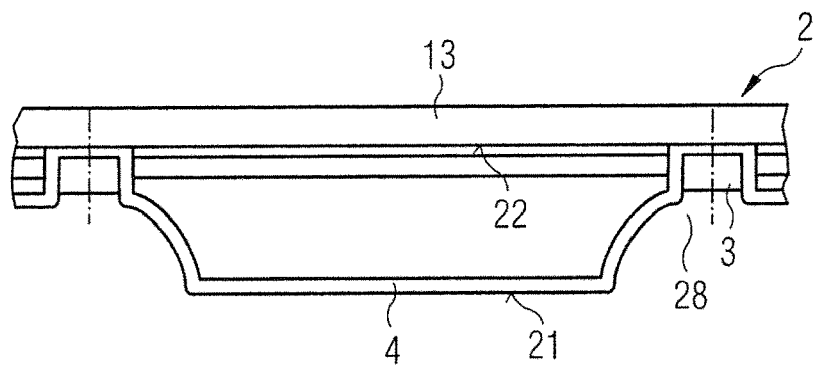

For further processing, as shown in FIG. 2H, a protective film 13 is applied all over to the carrier top 22. The protective film 13 covers the holes 3.

Figure 2I:
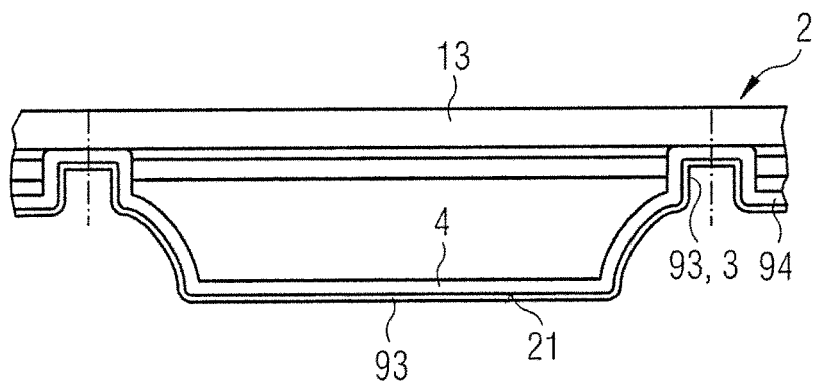

In FIG. 2I, it can be seen that a growth layer 93 is applied all over on the rear side 21 to the ceramic layer 4 as well as in the holes 3 and on the protective film 13. The growth layer 93 is thus produced continuously and coherently. For example, the growth layer 93 is sputtered or vapor deposited. A thickness of the growth layer 93 is at least 10 nm or 20 nm and/or at most 200 nm or 100 nm, for example. The growth layer 93 is formed from TiCu, for example.

Figure 2J:
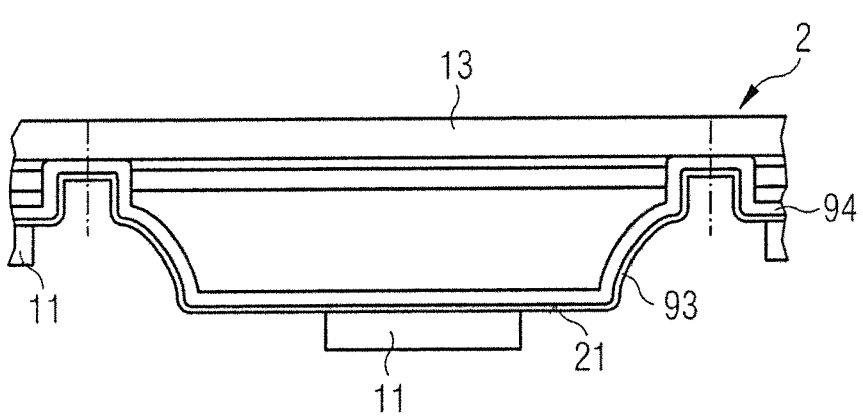

Then, as seen in FIG. 2J, a protective layer 11, for example, of a photoresist is applied on the rear side 21 to the growth layer 93 in places. Only those regions later covered by the contact layers 91, 92 remain uncovered by the protective layer 11, cf. also FIG. 1C in this regard. In particular, an edge of the carrier 2 is covered by the protective layer 11.

Figure 2K:
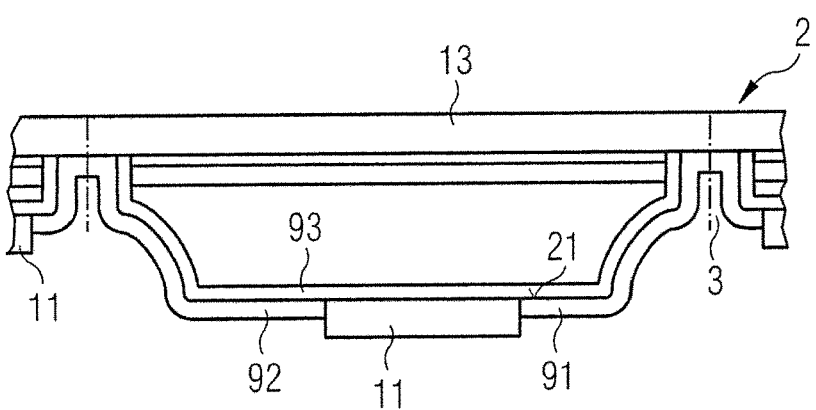

As shown in FIG. 2K, the metallic contact layers 91, 92 are then formed. To produce the contact layers 91, 92, a galvanic method is preferably used. It is thereby possible for the contact layers 91, 92 to extend in a constant or virtually constant thickness over all regions of the carrier underside 21 and the holes 3 not covered by the protective layer 11. The contact layers 91, 92 are formed from copper, for example.

Figure 2L:
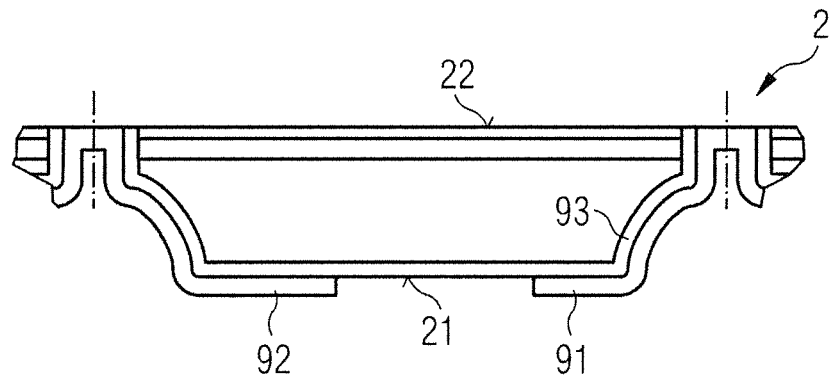

In FIG. 2L it can be seen that the protective film 13 and the protective film 11 have been removed. Furthermore, the growth layer 93 is removed from those regions that were previously covered by the protective layer 11. This is achieved in particular by back-etching.

Figure 2M:
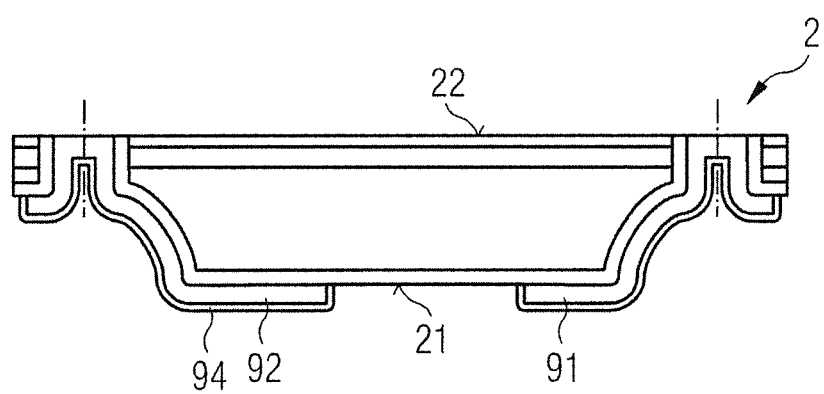

In the optional method step in FIG. 2M, the bonding metal 94 is applied to the contact layers 91, 92 and preferably covers all exposed surfaces of the contact layers 91, 92. Application of the bonding metal 94 takes place preferably by electroless chemical metal coating, also known as electroless plating. The bonding metal 94 is in particular Ni, Pd and/or Au, which is produced via so-called Nickel Electroless Palladium Immersion Gold. The bonding metal 94 is then preferably composed of sublayers of Ni, Pd and Au. It is likewise possible, unlike the drawing, that the contact layers 91, 92 are also composed of several sublayers stacked above one another.

Figure 2N:
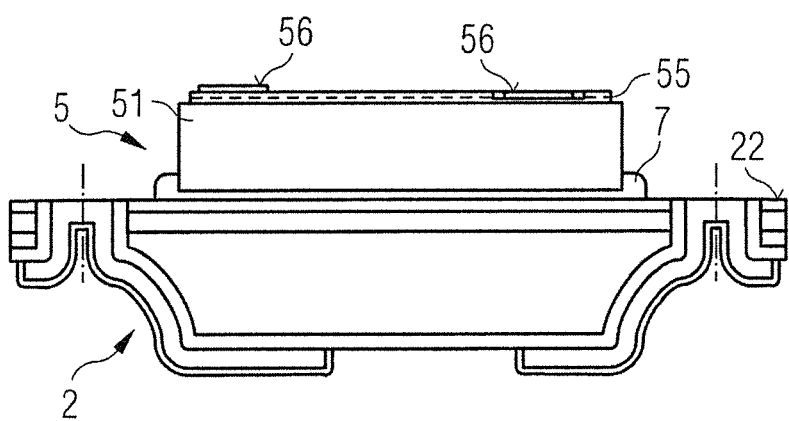

According to FIG. 2N, the semiconductor chip 5, in particular an LED chip, is glued onto the carrier top 22. The thickness of the transparent adhesive 7 between the carrier 2 and the semiconductor chip is preferably at most 10 µm or 5 µm or 2 µm.

Figure 2O:
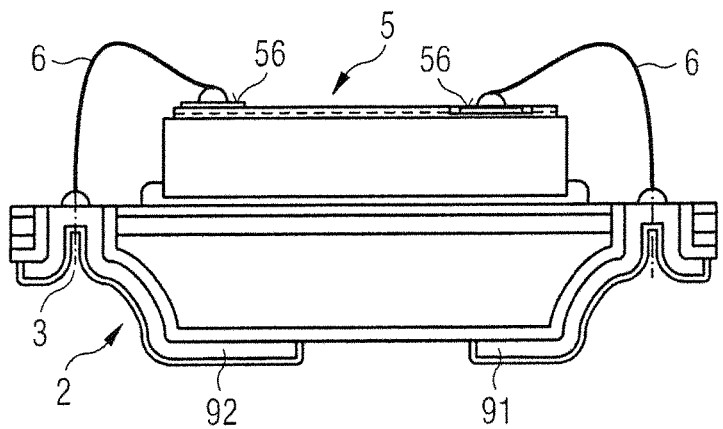

In the method step in FIG. 2O, the contact surfaces 56 of the semiconductor chip 5 are electrically connected via the electrical bonding means 6, formed by bond wires, to the contact layers 91, 92 at the openings 3.

The cast body, seen in FIG. 1, can optionally be applied, which is not illustrated in FIG. 2.

In FIGS. 2A to 2O, individual units of the carrier 2 are illustrated by the dashed and dotted lines running vertically. A plurality of such units is preferably combined into a carrier composite, so that a plurality of the semiconductor components 1 can be produced from one carrier composite.

Figure 2P:
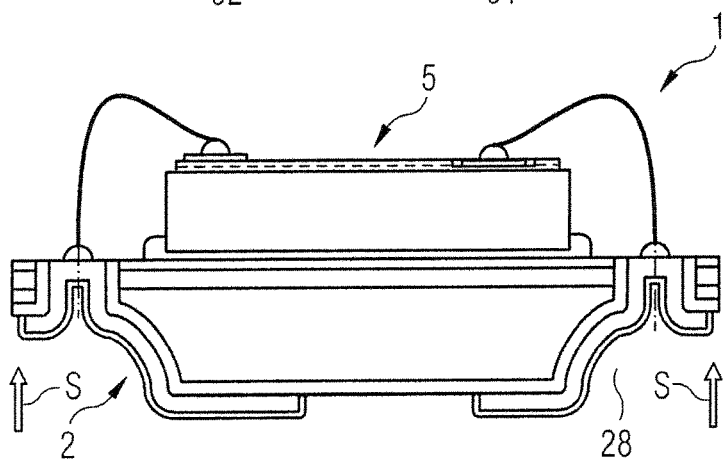

According to FIG. 2P, the carrier composite is divided into separation regions S so that the semiconductor components 1 are created. The division is carried out by sawing, for example. Depending on the thickness of the core material 24 in the trenches 28 and depending on the presence of the cast body 8, two different saw blade types can be used, that are controlled on the one hand for the cast body 8 and on the other for the ceramic layer 4 and the core material 24. For the cast body and the ceramic layer 4, abrasive discs with diamond particles are preferably used, whereas the comparatively soft core material 24, in particular aluminum, can be divided using a toothed saw blade. In the case of a very small layer thickness of the core material 24 remaining in the trenches 28, however, just a single saw blade can also be used.

Figure 3:
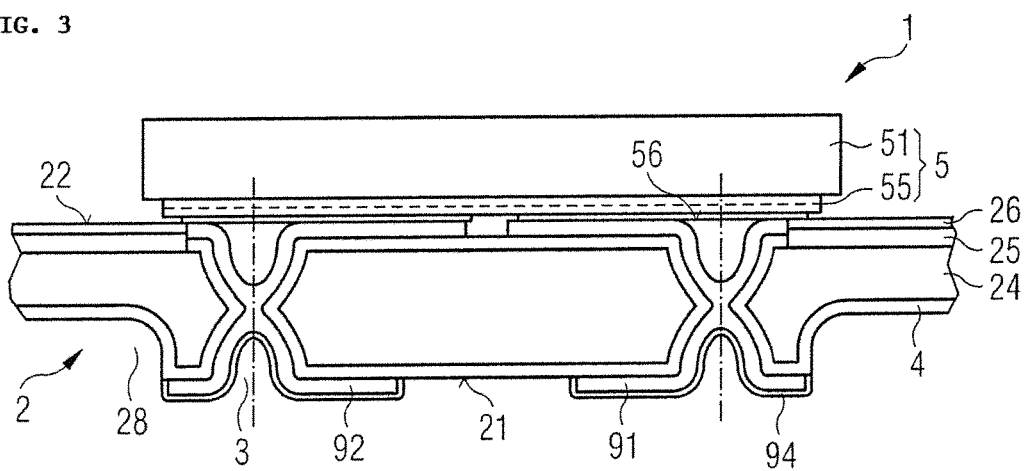
FIGS. 3 to 6 show schematic sectional views of examples of optoelectronic semiconductor components.

In the example of the semiconductor component 1 as shown in FIG. 3, the ceramic layer 4 is located on both the carrier underside 21 and on the carrier top 22. The holes 3 are formed outside the trenches 28 and, seen in plan view, located underneath the semiconductor chip 5. The contact layers 91, 92 also extend both on the carrier top 22 and on the carrier underside 21. The metal layer 25 and the dielectric mirror 26 are therefore removed in areas on the carrier top 22. According to FIG. 3, the semiconductor layer sequence 55 faces the carrier 2, unlike in FIGS. 1 and 2.

Figure 4:
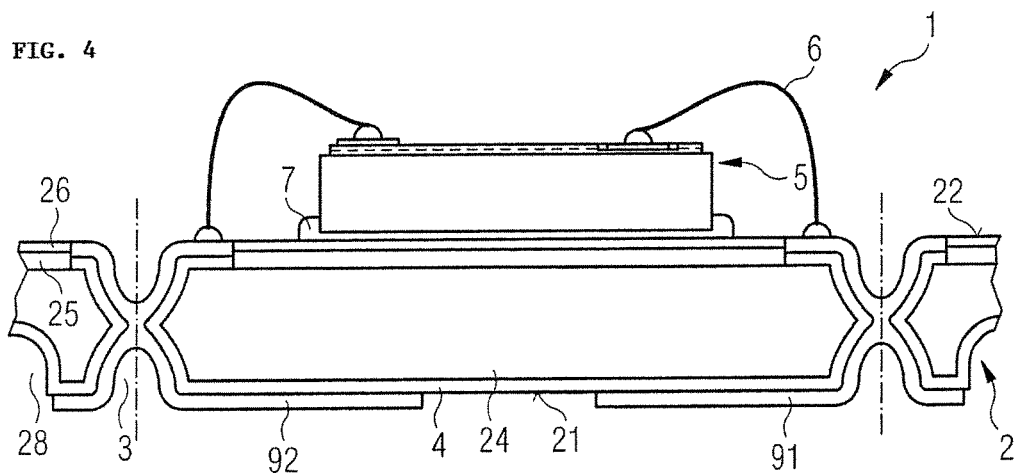

In the example in FIG. 4 also, the ceramic layer 4 and the contact layers 91, 92 extend on both major sides of the carrier 2. However, between the core material 24 and the semiconductor chip 5 the metal layer 25 and the dielectric mirror 26 are intact, unlike in FIG. 3. Also, according to FIG. 4, the holes 3 are located outside the trenches 28, wherein, deviating from FIG. 4, the holes 3 can also be located inside the trenches 28, analogous to FIG. 1.

Thus, according to FIG. 4, electrical contact regions for the electrical bonding means 6, thus in particular for bond wires, are arranged on the same side of the carrier 2 as the semiconductor chip 5. Here, the electrical contact regions lie on the carrier top 22, seen in plan view, both next to the holes 3 and next to the semiconductor chip 5. The electrical contact regions, seen in plan view, are preferably located between the holes 3 and the semiconductor chip 5. Such an arrangement of the electrical contact regions is especially preferable, as when applying the electrical bonding means 6 the core material 24 can then stabilize the metal contact layers 91, 92 in the area of the electrical contact regions. In other words, the electrical contact regions are preferably designed as bond surfaces, also described as bond pads.

Figure 5:
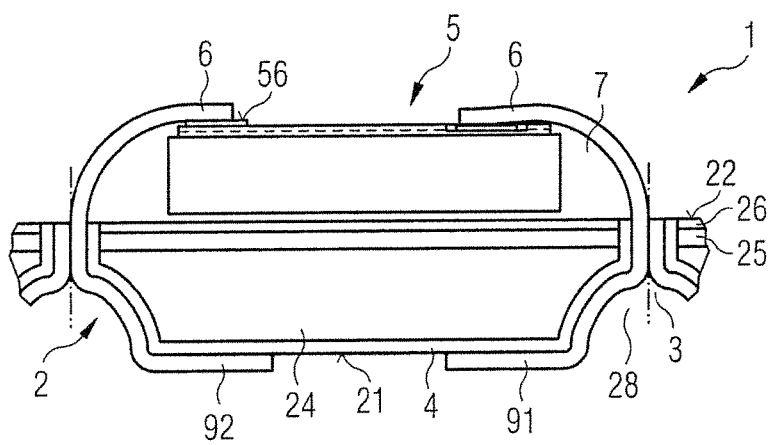

In the example in FIG. 5, a ramp is formed by the adhesive 7 from the carrier top 22 to a side of the semiconductor chip 5 remote from the carrier 2. The electrical bonding means 6 are applied to this ramp and are led like conductor tracks from the holes 3 to the contact surfaces 56.

Figure 6:
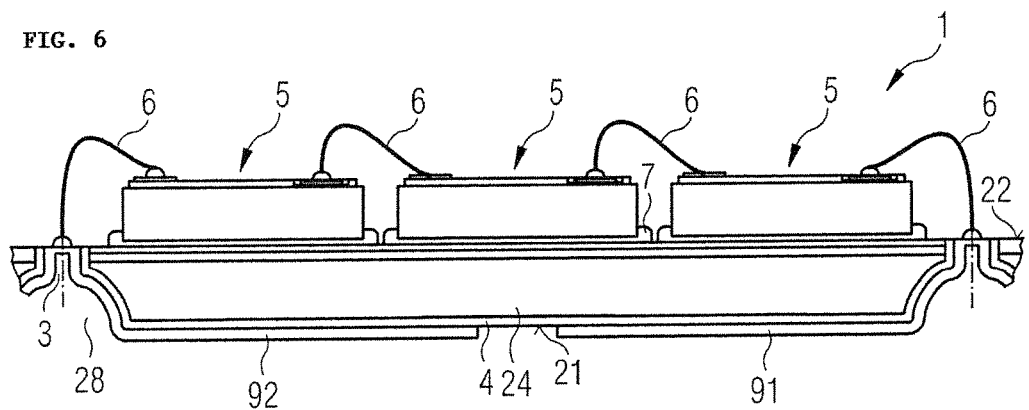

In the example in FIG. 6, several of the semiconductor chips 5 are connected electrically in series. Corresponding series circuits or, deviating from this, parallel circuits can also be used in connection with the examples in FIGS. 3 to 5.

The different configurations with respect to the electrical bonding means 6, the number of semiconductor chips 5, the trenches 28 and the holes 3, as illustrated in the various examples, can be combined with one another.

The methods and components described here are not limited by the description with reference to the examples. On the contrary, this disclosure comprises every new feature as well as every combination of features, which includes in particular every combination of features in the appended claims, even if the feature or combination is not itself explicitly indicated in the claims or examples.

This application claims priority of DE 10 2015 108 345.0, the subject matter of which is incorporated herein by reference.

The invention claimed is:

1. A method of producing optoelectronic semiconductor components comprising:
   A) providing a carrier with a carrier underside and a carrier top, wherein the carrier has a metallic core material and at least on the carrier top a metal layer and following this a dielectric mirror are applied to the core material,
   B) forming at least two holes through the carrier,
   C) producing a ceramic layer with a thickness of at most 150 μm at least on the carrier underside and in the at least two holes, wherein the ceramic layer comprises the metallic core material as a component,
   D) applying metallic contact layers to at least subregions of the ceramic layer on the carrier underside and in the at least two holes so that the carrier top electrically connects to the carrier underside through the holes, and
   E) applying at least one radiation-emitting semiconductor chip to the carrier top and electrical bonding of the semiconductor chip to the metallic contact layers,
      wherein the metal layer and the dielectric mirror cover the carrier top completely before step B) and, in step C), the metal layer and the dielectric mirror are removed only in an area of the at least two holes, and
      the carrier underside is formed by the metallic core material before step D) and is free of the metal layer and the dielectric mirror so that the carrier top remains free of the ceramic layer.

2. The method according to claim 1, wherein the metallic core material is aluminum or an aluminum alloy and the ceramic layer is produced electrochemically in step D) with a thickness of at most 75 μm and is made of aluminum oxide, and
   the metal layer is formed of silver and the dielectric mirror comprises alternating $SiO_2$ layers and $TiO_2$ layers.

3. The method according to claim 1, wherein, seen in a plan view of the carrier top, the semiconductor chip is encompassed all around by the carrier with a circumferential edge region and the at least two holes are located inside the edge region, and a mean width of the edge region is at least 10% and at most 60% of a mean edge length of the semiconductor chip.

4. The method according to claim 1, wherein, before step B), a trench is formed on the carrier underside, and
   the trench, seen in a plan view of the carrier underside, runs all around outside of the carrier, and in an area of the trench the carrier is thinned to at least 15% and at most 70% of an original carrier thickness.

5. The method according to claim 4, wherein, in step B), the at least two holes are formed in the region of a trench on two opposing sides of the semiconductor chip, and
   the trench has a greater width in the area of the holes than in remaining areas.

6. The method according to claim 4, wherein, in step B), the at least two holes, seen in plan view, are formed underneath the semiconductor chip and outside the trench and the trench has a uniform width.

7. The method according to claim 1, wherein, in step D), the contact layers close the holes on the carrier top and the closures of the at least two holes by the metallic contact layers respectively represent terminal areas for bond wires in step E).

8. The method according to claim 1, wherein the semiconductor chip is attached by a transparent, electrically insulating adhesive on the carrier top, and the semiconductor chip has a substrate transmissive for the radiation emitted, on which substrate a semiconductor layer sequence is grown on a side remote from the carrier.

9. The method according to claim 8, wherein the adhesive reaches as far as a side of the semiconductor chip remote from the carrier and forms a ramp on this side for layered, electrical bonding means between the at least two holes and electrical contact surfaces of the semiconductor chip.

10. The method according to claim 1, wherein a plurality of carriers are combined in a carrier composite and, after step E), the carrier composite is singulated into the carriers in that the carrier composite is divided in separation regions.

11. The method according to claim 1, wherein several of the semiconductor chips, electrically connected in series via bond wires, are located on the carrier top.

12. The method according to claim 1, wherein the method steps are performed in the order indicated.

13. An optoelectronic semiconductor component produced by the method of claim 1, comprising:
    the carrier with the carrier underside and with the carrier top, and
    the at least one semiconductor chip emitting the radiation during operation on the carrier top, wherein
    the carrier has the metallic core material and the metal layer and following this the dielectric mirror are applied to the metallic core material at least on the carrier top,
    the at least two holes are formed through the carrier,
    the ceramic layer with a thickness of at most 100 μm is located at least on the carrier underside and in the holes and the ceramic layer comprises the core material as a component,
    the metallic contact layers are applied to at least subregions of the carrier underside and in the at least two holes so that the carrier top electrically connects to the carrier underside through the at least two holes and the metallic contact layers on the carrier underside are set up for external electrical and mechanical attachment of the semiconductor component, and
    the semiconductor chip electrically connects to the contact layers by electrical bonding means.

14. A method of producing optoelectronic semiconductor components comprising:
    A) providing a carrier with a carrier underside and a carrier top, wherein the carrier has a metallic core material and at least on the carrier top a metal layer and following this a dielectric mirror are applied to the core material,
    B) forming at least two holes through the carrier,
    C) producing a ceramic layer with a thickness of at most 150 μm at least on the carrier underside and in the at least two holes, wherein the ceramic layer comprises the metallic core material as a component,
    D) applying metallic contact layers to at least subregions of the ceramic layer on the carrier underside and in the at least two holes so that the carrier top electrically connects to the carrier underside through the holes, and
    E) applying at least one radiation-emitting semiconductor chip to the carrier top and electrical bonding of the semiconductor chip to the metallic contact layers,
       wherein the metal layer and the dielectric mirror are removed before step B) in places in electrical contact regions for bond wires on the carrier top seen in plan view next to the semiconductor chip and next to the at least two holes, and the metallic contact layers are produced in the electrical contact regions, which are limited to the carrier top.

\* \* \* \* \*